United States Patent [19]

Cohen et al.

[11] Patent Number: 4,529,315
[45] Date of Patent: Jul. 16, 1985

[54] MULTI-CHANNEL POSITION DETECTION SYSTEM

[75] Inventors: Brian S. Cohen, South Deerfield, Mass.; Arthur C. Sanderson; Kevin J. Dowling, both of Pittsburgh, Pa.

[73] Assignee: Westinghouse Electric Corp., Pittsburgh, Pa.

[21] Appl. No.: 461,798

[22] Filed: Jan. 28, 1983

[51] Int. Cl.³ .............................................. B23Q 15/24
[52] U.S. Cl. .................................. 356/375; 356/400; 901/47
[58] Field of Search ............... 356/375, 399, 400, 373; 455/603; 901/46, 47, 35; 414/730

[56] References Cited

U.S. PATENT DOCUMENTS

| | | | |
|---|---|---|---|
| 3,007,097 | 10/1961 | Shelley et al. | 901/47 |
| 3,698,820 | 10/1972 | Hanff et al. | 356/437 |
| 4,081,669 | 3/1978 | Klingman | 901/47 |
| 4,109,158 | 8/1978 | Blitchington et al. | 356/400 |

*Primary Examiner*—R. A. Rosenberger
*Assistant Examiner*—Michael Vollero
*Attorney, Agent, or Firm*—Thomas R. Trempus

[57] ABSTRACT

The invention is a multi-channel position detection system which utilizes several separate emitters and a single photodetector to, for example, align a multi-lead component manipulator with a predetermined location in a printed circuit board. An oscillator circuit generates a modulated signal for each emitter and a multiplier circuit develops an output signal based upon the oscillator output and the photodetector output. The photodetector provides an output responsive to the emitter signal as attenuated by the circuit board location relative to the emitter. When the lead hole of the circuit board is aligned with the emitter and photodetector minimum attenuation of the signal occurs.

6 Claims, 5 Drawing Figures

MULTI-CHANNEL POSITION DETECTION SYSTEM

BACKGROUND OF THE INVENTION

The invention relates to a position detection system. More particularly, the invention is directed to a position detection system using modulated light sources that is useful in locating a desired pattern of apertures in a surface, such as a circuit board.

It is a general practice to assemble electrical components of low production volume, high component density printed circuit boards by hand. It is an industry-wide objective to introduce computer controlled robotic manipulators into the aforedescribed manufacture of circuit boards. Such robotic manipulators provide more accurate assembly and production flexibility which will ultimately lower the costs of manufacturing specialized circuit board assemblies.

Although a significant degree of accuracy has been obtained in the area of positional control of the robot end effector or manipulator for many different tasks, circuit board construction presents several unique problems, for example: component orientation, component acquisition, component positioning and component insertion.

It is generally an object of this invention to provide a system to facilitate the positioning of an acquired component at the desired circuit board location.

It is an additional object of this invention to provide an optical feedback system for use with a multilead component manipulator. The optical feedback system permits the use of a single photodetector apparatus in conjunction with several modulated light sources.

SUMMARY OF THE INVENTION

The invention is a multi-channel position detection system for locating a desired pattern of apertures in a surface such as the component lead holes in a printed circuit board. A photodetector is located on one side of the circuit board proximate the desired pattern of apertures. At least two emitters are disposed on the opposite side of the surface. Circuit means generate a distinct modulated signal for each emitter which in turn generates a modulated output to which the photodetector is responsive. The emitter output is attenuated according to its relationship with the surface and the aperture. Additional circuit means are responsive to both the modulated signal and the detector output signal in order to generate a separate output signal for each emitter output. A minimal attenuation of an emitter output signal indicates emitter alignment with the aperture, while maximum attenuation indicates non-alignment.

BRIEF DESCRIPTION OF THE DRAWINGS

The above as well as other features and advantages of this invention will become apparent through consideration of the detailed description in connection with the accompanying drawings in which.

DETAILED DESCRIPTION OF THE INVENTION

The multi-channel position detection system of this invention is ideally suited for use in combination with a manipulator device designed for printed circuit board component insertion. Accordingly, the present invention is illustrated and described herein with such an apparatus. It is to be understood that this detection system is not limited to use with a single apparatus embodiment, but can be incorporated with any device which requires positional information at multiple locations. More particularly, the present detection system permits multiple positional determinations in an extremely restricted spatial arrangement.

Figure 1:
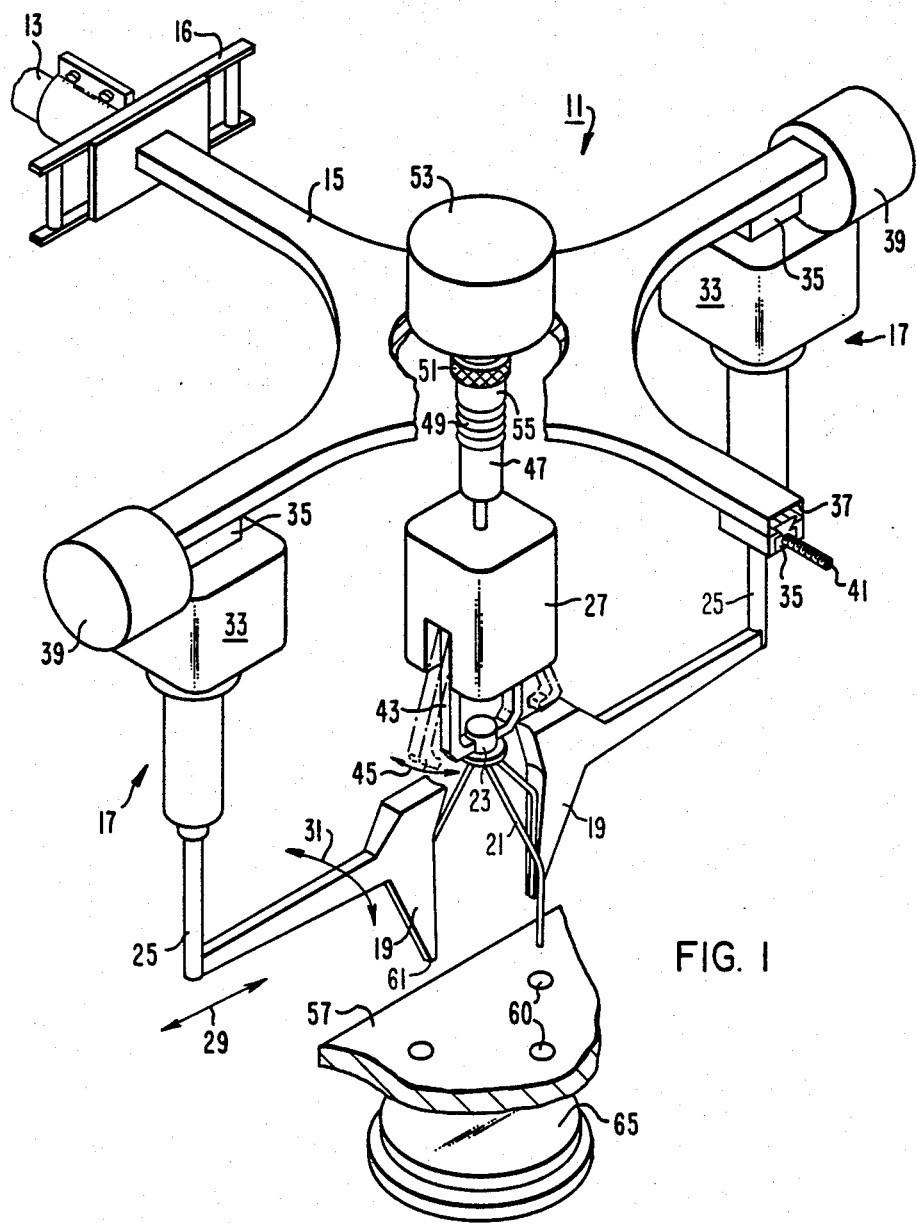
FIG. 1 is a somewhat schematical illustration of a multi-lead component manipulator with portions cut away to more clearly distinguish its features.

An apparatus for the acquisition, alignment and insertion of a multi-lead component into the appropriate mounting holes of a printed circuit board is illustrated in FIG. 1 and is generally designated by the reference character 11. The apparatus or manipulator device 11 is designed for use with a computer controlled industrial manipulator and is mounted onto the movable arm 13 of such a device by means of a mounting plate 15. A compliant device 16 is typically disposed therebetween. The manipulator device mounting plate 15 additionally functions as a frame member which supports the individual structural components of the manipulator device 11. At least two and preferably three radially disposed, symmetric assemblies 17 are associated with the mounting plate 15. It is to be appreciated that while the use of two symmetric assemblies permit the manipulation of two lead components such as resistors and capacitors, three symmetric assemblies make it possible to manipulate both two lead components and three lead components such as transistors. Each symmetric assembly 17 includes a component part lead guide means 19 which engages a lead 21 of an electronic component 23. The lead guide means 19 is supported by an arm 25 capable of radial movement and arcuate movement relative to the gripper assembly 27, as indicated by arrows 29 and 31 respectively. The arcuate motion of the arm 25 is effected by a motive means such as a servo-galvanometer 33 which is capable of accurately generating such motion. The servo galvanometer 33 is supported from a slide member 35 which travels along a guide means 37 provided in the mounting plate 15. Motive means such as a radial linear displacement servometer 39 provide incremental movement to the slide member 35 through a geared drive shaft 41. Thus, the lead guide means 19 as supported by the arm 25 are manipulated both radially and arcuately to effect component lead 21 acquisition and alignment. The radial and arcuate movement of the arm can be effected either individually or simultaneously as will be hereinafter more fully described.

The gripper assembly 27 includes fingers 43 which engage and grip the electrical component 23 to be manipulated. The fingers 43 are movable from a closed position to an open position as shown in dash-dot lines and indicated by the directional arrow 45. The fingers 43 are actuated by a gripper piston 47 which typically is pneumatically operated. The gripper piston 47 and gripper assembly 27 is supported by a compliant device 49 such as a flexible motor shaft coupling. The compliant device 49 provides a degree of flexibility to the manipulative operation of the gripper assembly 27 in order to facilitate component lead alignment and lead insertion into the printed circuit board.

The compliant device 49 is both supported by, and vertically manipulated relative to the mounting plate 15, by the shaft 51 associated with a motive means 53 such as a linear displacement servomotor. The servomotor 53 is responsive to a transducer 55 disposed between the compliant device 49 and the shaft 51. The transducer 55 provides tactile feedback to the servomotor 53 primarily during the insertion of the component into the circuit board 57.

Figure 2:
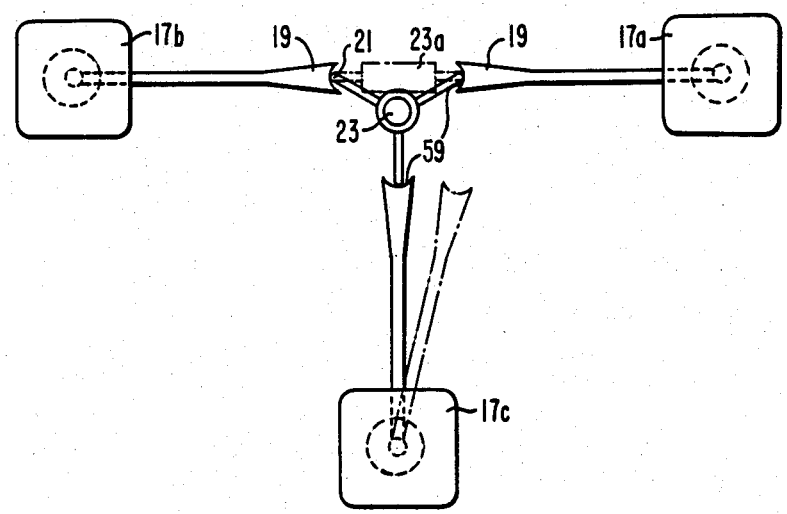
FIG. 2 is a diagrammatic illustration of the radial and circumferential displacement motion generated during the operation of this component manipulator.

In FIG. 2, the symmetric assemblies 17 of the manipulator device 11 schematically illustrate both the radial and arcuate movement associated with a three lead component shown in full and a two-lead component shown in dash-dot. Considering first a three-lead component 23, it can be seen that the lead guide 19 of each assembly 17a through c has a concave seating surface 59 which engages a component lead 21. The concave surface 59 tends to retain the lead so that positive adjustments to the lead can be effected through arm movement. If a two-lead component 23a is being manipulated, only assemblies 17a and 17b are utilized. Assembly 17c can be retracted from the component and/or positioned to the side of the component by the motive means 33. (Both the two-lead component and the position of the assemblies during two-lead component manipulation are shown in dash-dot line.)

The combination of independent radial and arcuate movement in each assembly 17 allows a single manipulator device to be utilized for a variety of component applications. Thus, a single station industrial manipulator can effectively and efficiently be utilized in the fabrication of a printed circuit board requiring components having various lead configurations.

Figure 3:
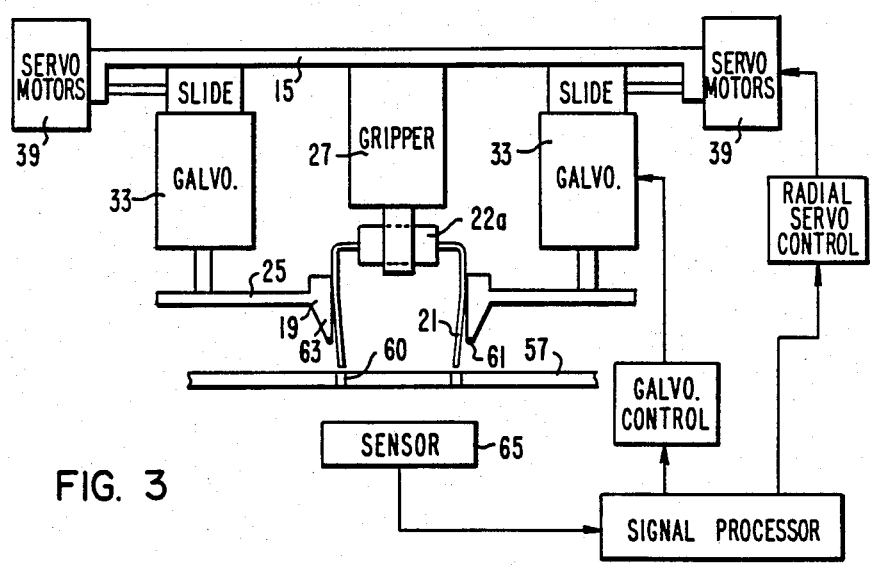
FIGS. 3 and 4 are schematic illustrations of an optical feedback system according to the teachings of this invention.

The optical and tactile feedback features are specifically described in connection with FIGS. 3, 4 and 5. As previously indicated, the arrangement of the servomotor 39 and the galvanometer 33 in each assembly 17 allows controllable motion of the component leads in two directions. Through cooperation with the optical feedback system, somewhat schematically illustrated in FIG. 3, the aforementioned motive means 33 and 39 are capable of "homing" in on the center of the hole 60 of the printed circuit board 57 through which the lead is to be inserted.

The optical feedback system of this invention includes an IR photoemitter 61 located in the lower portion 63 of the finger 19. A photodiode detector 65 is positioned below the circuit board 57 so that the coordinated relationship exists between the hole into which the component lead is to be inserted and the photodiode detector 65. In one configuration, for example, the photodiode detector 65 is mounted in a fixed position and the circuit board 57 is supported in a movable framework which positions the circuit board relative to the photodiode detector 65 for each component insertion task. The emitter 61 output passes through the lead hole 59 of the circuit board onto the photodiode positioned below the hole 59. The emission of emitter 61 contacting the photodiode detector 65 is converted to a voltage output signal which is a function of the degree of the emission passing through the lead hole 59. The output voltage signal is at its maximum level when the emitter 61 is aligned with the hole 59. Thus, the relationship of the component lead to the lead hole is known. The voltage output level functions as a control signal to the servomotor 39 and the servogalvanometer 33.

The multi-channel position detection system of this invention uses frequency division multiplexing wherein a continuous output signal is provided and potential errors created by noise due to ambient light is substantially eliminated.

Frequency division multiplexing involves modulating each of the light sources such that the light beam has an intensity of the form: A cos $2\pi f(t)$. The three beams have independent alternation and are all collected with the same detector. For an alternation $f(r_i)$ of the ith source, the detector output is:

$$\sum_{i=1}^{3} f(r_i) \cos 2\pi f_i(t);$$

The functional dependence is contained in the amplitude, thus readily enabling the separation of the light from both DC and 60 Hertz noise. A simple high pass filter removes the effects of ambient light and AC line noise.

There are several methods by which channel separation can be effected, examples of which include the uses of bandpass filters and the demodulation of the channels through the use of multipliers. The preferred embodiment incorporates multiplying the detector output by the carrier frequency for synchronous detection. This is made clear by considering the detector output as several AM waves and the trigonometric statement:

$$\cos (A) \cos (B) = \tfrac{1}{2} \cos (A-B) + \tfrac{1}{2} \cos (A+B)$$

The multiplication of the detector output with the carrier yields a term proportional to $f(r_i)$ and a term that involves the sum and difference of the carrier and the jth components of the detector output where $j \neq i$. The unwanted terms can be eliminated using a bandpass filter.

Synchronous detection using a multiplier yields an acceptable signal to noise ratio, a high immunity over oscillator frequency drift and an improved time domain response when compared to a bandpass system.

Figure 4:
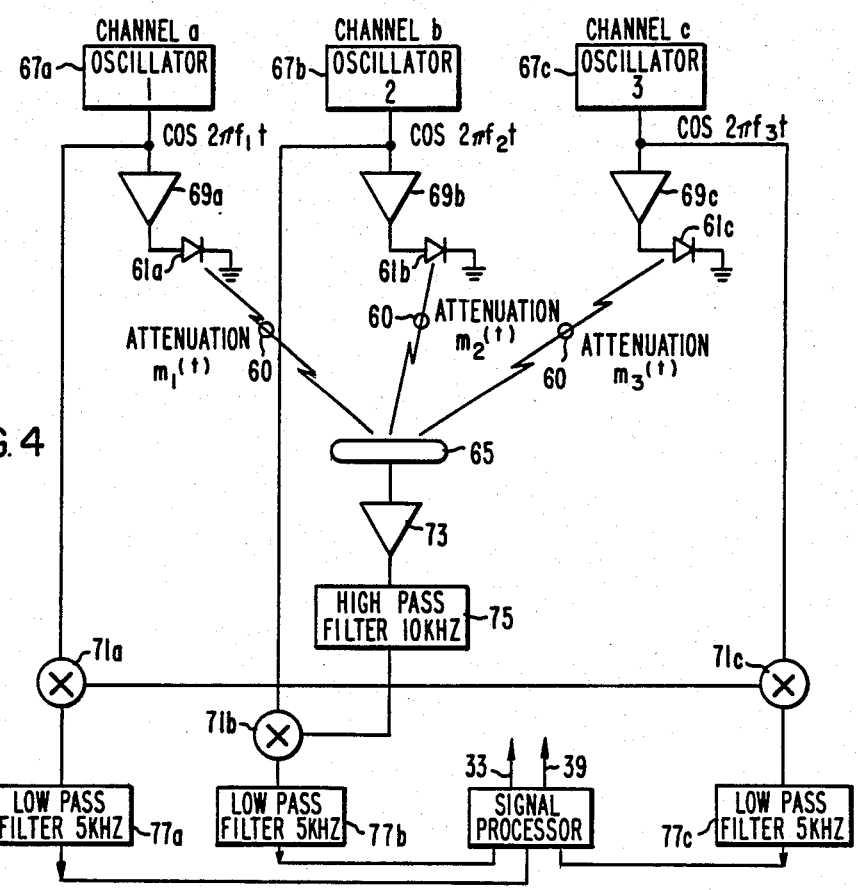
Figure 5:
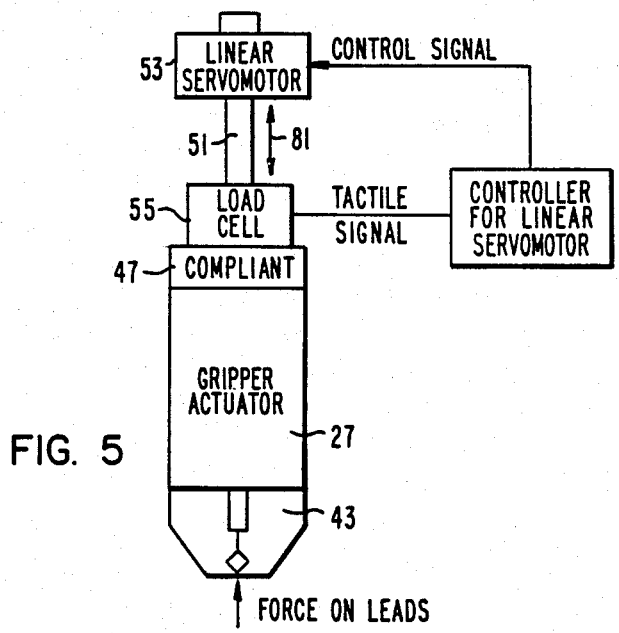
FIG. 5 is a schematic illustration of a tactile feedback system.

Turning to FIG. 4, a multiplier demodulation system according to this invention is schematically illustrated in a three lead component manipulator, as previously described in association with FIG. 1. The actual channel frequencies selected for the demodulation system may vary; accordingly, the values presented herein should be viewed as an example of a demodulator system according to this invention. The channel frequencies of the illustrated embodiment were chosen to be 40, 50 and 60 KHz for channels "a" through "c" respectively. In order to satisfy the constraints of channel bandwidth and message bandwidth, device frequency is limited herein to below a 100 KHz bandwidth. The message bandwidth is assumed to be 1 KHz, thus allowing a channel bandwidth of at least 2 KHz. A 1 KHz message bandwidth allows quick response to position movements. The channel bandwidth of 10 KHz allows the use of first and second order filters to obtain good separation. The bandwidth provides a safety factor in the unlikely event that a channel oscillator should drift.

Channel "a" includes an oscillator 67a which provides a signal of a first preselected frequency to the emitter driver circuit 69a and the multiplier 71a and an IR emitter 61a. Channel "b" includes an oscillator 67b which provides a signal of a second preselected frequency to the emitter driver circuit 69b and multiplier 71b, and an IR emitter device 61b. Channel C includes an oscillator 67c which provides a third preselected frequency to the multiplier 71c and the driver circuit 69c and includes a IR emitter 61c. The photodiode detector 65 is positioned below the circuit board at a predetermined component part location. An amplifier circuit 73 and a high pass filter 75 convey the signal detected by the photodiode detector 65 to the three multipliers 71a through c. Each multiplier, through its associated low pass filter, 77a through c, generates an output signal reflective of the degree of attenuation, if any, resulting from the positional relationship of the circuit board lead holes 60 relative to the IR emitters. The output signals are utilized as input signals to a servomotor control circuit and a galvanometer control circuit in order to effect positional adjustment of the manipulator fingers.

The use of frequency division multiplexing according to this invention allows the simultaneous position measurement of several independently relative motions.

After the component leads have been moved into position, the component is pushed into place so that each lead 21 is inserted into the proper hole of the circuit board. This task is accomplished by the motive means 53 which is controlled by a tactile or force feedback system. As schematically illustrated in FIG. 5. The transducer 55 is a piezoelectric load cell which outputs a voltage in response to the changes in axial force on the component leads during insertion. The dynamic response of this signal is rapid enough to prevent the bending of the component leads in the event of lead-hole non-alignment. Additionally, the transducer is sensitive enough to provide a force signal in response to the frictional forces generated in the guides of the fingers 19 and in the holes 60 of the circuit board. The frictional signal and position information obtainable from the linear servomotor 53 provide information which is sufficient to verify that the component is properly inserted in the circuit board 57.

What has been described is a multi-channel optical detection system for detecting several independent, relative movements. While the discussion herein has been directed to a three-channel system application, this has been done for illustrative purposes only. The multi-channel optical system of this invention can readily incorporate only two channels or more than three channels by selecting channel frequencies in accordance with the guidelines set forth in connection with the description of FIGS. 3, and 4.

What is claimed is:

1. A multi-channel position detection system for an industrial manipulator which has individual means for engaging and manipulating each of the separate leads of a multi-lead component for the insertion of said leads into a predetermined hole pattern location in a circuit board, said system comprising:
   a first emitter means in one of said lead engaging means proximate the component lead and at least a second emitter means in another of said lead engaging means;
   a photodetector disposed below the predetermined hole pattern location of the circuit board;
   circuit means for generating a distinct modulated signal for each of said emitters whereby each of said emitters generates a modulated output to which said photodetector is responsive, said emitter output received by the photodetector being attenuated according to whether the emitter output passes through the circuit board hole or is at least in part blocked by the circuit board and whereby said photodetector generates an output responsive to said emitter output; and
   circuit means responsive to each said modulated signal and said detector output signal as based on each attenuated emitter output signals for generating a separate output signal for each said emitter output, whereby minimal attenuation of each modulated emitter output indicates lead relationship to the predetermined circuit board hole locations.

2. The multi-channel position detection system according to claim 1 wherein the industrial manipulator engaging means include motive means for effecting the movement thereof and the component lead and wherein said motive means are responsive to the output of the circuit means responsive to the modulated signal and photodetector output signal.

3. The multi-channel position detection system according to claim 2 wherein the circuit means responsive to each modulated signal and the detector output signal is a frequency division multiplexing circuit which provides an output to which the motive means of the engaging means is responsive.

4. The multi-channel position detection system according to claim 3 wherein the industrial manipulator has three individual lead engaging means and an emitter means is disposed in each of said lead engaging means and wherein the circuit means for generating a modulated signal for each said emitter includes an oscillator circuit means and an infrared emitter driver circuit means.

5. The multi-channel position detector system according to claim 4 wherein the circuit means responsive to the detector output signal includes preamp circuit means and filter means.

6. A method for locating a predetermined hole pattern in a circuit board for the insertion of each of the separate leads of a multi-lead component thereinto by an industrial manipulator which has individual means for engaging and manipulating each of the separate leads, and which manipulator has a first emitter means in one of the individual lead engaging means proximate the component lead and at least a second emitter means in another of the individual lead engaging means and wherein a photodetector means is disposed below the predetermined hole pattern location of the circuit board, said method comprising the steps of:
   generating a first distinct modulated signal and at least a second distinct modulated signal, each of said signals being detected by said photodetector means;
   emitting said first distinct modulated signal from the at least first emitter means and emitting the at least second distinct modulated signal from the at least second emitter means, whereby the emitted signals are directed toward the photodetector means;
   effecting relative movement between the signals and the circuit board whereby signals passing through a hole therein are received by the photodetector means and attenuated according to whether the emitter output passes through the hole or is at least in part blocked by the circuit board; and
   determining the degree of attenuation of each signal received by the photodetector means whereby minimized attentuation of each modulated emitter output indicates alignment with a pretermined hole pattern in the circuit board.

* * * * *